(12) United States Patent
Choi

(10) Patent No.: US 7,641,937 B2
(45) Date of Patent: Jan. 5, 2010

(54) METHOD FOR MANUFACTURING ABSORBER LAYERS FOR SOLAR CELL

(75) Inventor: In-hwan Choi, Kyunggi-Do (KR)

(73) Assignee: In-Solar Tech Co., Ltd., Seoul (KR)

( * ) Notice: Subject to any disclaimer, the term of this patent is extended or adjusted under 35 U.S.C. 154(b) by 354 days.

(21) Appl. No.: 10/565,975

(22) PCT Filed: May 27, 2004

(86) PCT No.: PCT/KR2004/001251

§ 371 (c)(1),
(2), (4) Date: Jan. 26, 2006

(87) PCT Pub. No.: WO2005/010999

PCT Pub. Date: Feb. 3, 2005

(65) Prior Publication Data

US 2006/0204659 A1    Sep. 14, 2006

(30) Foreign Application Priority Data

Jul. 26, 2003   (KR) .................. 10-2003-0051828
Apr. 27, 2004   (KR) .................. 10-2004-0029221

(51) Int. Cl.
*C23C 16/00*   (2006.01)

(52) U.S. Cl. .............. 427/248.1; 427/255.28; 427/255.29; 427/255.34; 427/255.7

(58) Field of Classification Search ............ 427/255.7, 427/255.29, 255.28, 248.1, 255.34
See application file for complete search history.

(56) References Cited

U.S. PATENT DOCUMENTS

| | | | | |
|---|---|---|---|---|
| 4,652,332 | A | * | 3/1987 | Ciszek ........................ 117/3 |
| 5,028,274 | A | * | 7/1991 | Basol et al. ................. 136/264 |
| 5,436,204 | A | * | 7/1995 | Albin et al. ................. 438/488 |
| 5,441,897 | A | * | 8/1995 | Noufi et al. ................. 438/95 |
| 5,567,469 | A |   | 10/1996 | Wada et al. |

(Continued)

FOREIGN PATENT DOCUMENTS

JP        08-316230        11/1996

OTHER PUBLICATIONS

Los Alamos National Laboratory's Chemistry, "Periodic Table of the Element", http://periodic.lanl.gov/downloads/PeriodicWebSite.pdf, p. 1-3, 2001.*

*Primary Examiner*—Binh X Tran
(74) *Attorney, Agent, or Firm*—Oblon, Spivak, McClelland, Maier & Neustadt, L.L.P.

(57)    ABSTRACT

The present invention relates to a process for producing $CuInSe_2$ and $CuIn_{1-x}Ga_xSe_2$ thin films used as an absorption layer for a solar cell such that they have a structure near to chemical equivalence ratio. The present invention provides a process for producing a thin film for a solar cell, comprising forming an InSe thin film on a substrate by Metal Organic Chemical Vapor Deposition using a $[Me2In-(\mu SeMe)]_2$ precursor; forming a $Cu_2Se$ thin film on the InSe thin film by Metal Organic Chemical Vapor Deposition using a (hfac)Cu (DMB) precursor, and forming a $CuInSe_2$ thin film on the $Cu_2Se$ thin film by Metal Organic Chemical Vapor Deposition using a $[Me_2In-(\mu SeMe)]_2$ precursor. Further, the process may further comprise forming a $CuIn_{1-x}Ga_xSe_2$ thin film on the $CuInSe_2$ thin film by Metal Organic Chemical Vapor Deposition using a $[Me2Ga-(\mu SeMe)]_2$ precursor.

10 Claims, 8 Drawing Sheets

U.S. PATENT DOCUMENTS

| | | |
|---|---|---|
| 5,731,031 A | 3/1998 | Bhattacharya et al. |
| 5,858,121 A * | 1/1999 | Wada et al. .................. 136/265 |
| 5,976,614 A | 11/1999 | Bhattacharya et al. |
| 6,518,086 B2 * | 2/2003 | Beck et al. .................... 438/95 |
| 6,736,986 B2 | 5/2004 | Stanbery |

* cited by examiner

METHOD FOR MANUFACTURING ABSORBER LAYERS FOR SOLAR CELL

TECHNICAL FIELD

The present invention relates to a process for producing an absorption layer for a solar cell, and more particularly to a process for producing $CuInSe_2$ and $CuIn_{1-x}Ga_xSe_2$ thin films having a structure close to a chemical equivalence ratio using MOCVD.

BACKGROUND ART

A ternary thin film of $CuInSe_2$ (hereinafter, referred to as "CIS") or $CuIn_{1-x}Ga_xSe_2$ (hereinafter, referred to as "CIGS") is a semiconductor compound that has been actively studied recently.

Unlike a conventional solar cell using silicon, such a CIS-based thin film solar cell can be fabricated to have a thickness of less than 10 μ and has stable characteristics even with prolonged use thereof. In addition, by experimentation, it has been determined to have an energy conversion efficiency of up to 19% that is superior to other solar cells and thus commercialization thereof to a lower price high efficiency solar cell capable of substituting silicon is highly promising.

In this connection, a variety of processes for producing the CIS thin film have been recently reported. For example, one method, as described in U.S. Pat. No. 4,523,051, is to vapor deposit elemental metals simultaneously under vacuum atmosphere. However, this method uses an expensive effusion cell and thus is uneconomical with respect to mass production and realization of large area. Another method, as described in U.S. Pat. No. 4,798,660, is to heat and selenize a Cu—In precursor under selenium-containing gas atmosphere such as $H_2Se$. However, $H_2Se$ gas is highly toxic to the human body and thus dangerous in mass production of the CIS thin film. Other methods such as electrodeposition, Molecular Beam Epitaxy, and the like have been proposed, but they are expensive or feasible only on a laboratory scale, thus being unsuitable for mass production of the CIS thin film.

Therefore, in order to implement mass production of a good quality CIS thin film, it is most preferred to use Metal Organic Chemical Vapor Deposition (hereinafter, referred to as "MOCVD") widely used in a conventional semiconductor process.

However, MOCVD is a generalized technique capable of producing a good quality thin film at lower production costs in the semiconductor industry, but production of the CIS solar cell using the conventional MOCVD technique presents problems associated with high production costs and complex process resulting in difficulty in mass production of good quality thin films.

In order to grow the CIS or CIGS thin film, a conventional process involves sputtering molybdenum to be vapor deposited on a glass substrate, and then using it as the substrate for growing the thin film. However, the glass substrate is not flexible, and thus there was a problem in which the glass substrate cannot be used in a situation requiring free deformation thereof.

DISCLOSURE OF THE INVENTION

Therefore, the present invention has been made in view of the above problems, and it is an object of the present invention to provide a process for producing a CIS or CIGS thin film having a structure close to a chemical equivalence ratio using MOCVD.

It is another object of the present invention to provide a process for producing CIS or CIGS thin film for a solar cell using MOCVD in which a preparation process is simple and mass production is possible at lower production costs.

It is a further object of the present invention to provide a process for producing a CIS or CIGS thin film for a solar cell, which is less harmful to the human body and is more environmentally-friendly.

It is another object of the present invention to provide a process for producing a CIS or CIGS thin film for a solar cell that is freely deformable and flexible.

BRIEF DESCRIPTION OF THE DRAWINGS

The above and other objects, features and other advantages of the present invention will be more clearly understood from the following detailed description taken in conjunction with the accompanying drawings, in which.

BEST MODE FOR CARRYING OUT THE INVENTION

Now, a process for producing CIS or CIGS thin film of the preferred embodiments in accordance with the present invention will be described in detail with reference to the attached drawings.

Figure 1:
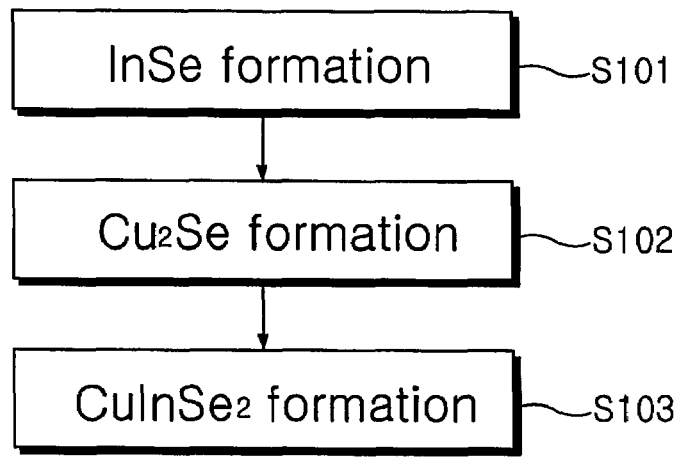
FIG. 1 is a process flow schematically illustrating production of a $CuInSe_2$ thin film in accordance with a first embodiment of the present invention.

FIG. 1 schematically illustrates a process flow for production of a CIS thin film in accordance with a first embodiment of the present invention;

As shown in FIG. 1, an InSe thin film is formed on a substrate made of Mo material by MOCVD using $[Me_2In(\mu SeMe)]_2$, a single precursor including In and Se (step S101). Me represents methyl, and U means that Se is double-bonded to In. As the substrate, a thin and flexible substrate made of the Mo material may be used instead of a conventional glass substrate, and thus various shapes of solar cells may be implemented.

Next, a $Cu_2Se$ thin film is formed on the InSe thin film formed in step S101 by MOCVD using a monovalent Cu precursor (hfac)Cu(DMB) (step S102). The hfac and DMB are abbreviations of hexafluoroacetylacetonate and 3,3-dimethyl-1-butene, respectively.

Next, a $CuInSe_2$ thin film is formed on the $Cu_2Se$ thin film formed in step S102 by MOCVD using $[Me_2In-(\mu SeMe)]_2$, a single precursor including In and Se (step S103). [$Me_2In$-

(μSeMe)]$_2$, which is a precursor for forming the CuInSe$_2$ thin film, is the same as that used in step S101.

An apparatus used for growing the thin film in the present invention is a low pressure MOCVD. The low pressure MOCVD used in the present invention is equipped with a plurality of bubblers containing precursors such as (hfac)Cu(DMB), [Me$_2$In-(μSeMe)]$_2$ and [Me$_2$Ga-(μSeMe)]$_2$. Therefore, sequential use of the bubblers containing respective precursors makes it possible to prepare the CIGS thin film in a single process.

Figure 2:
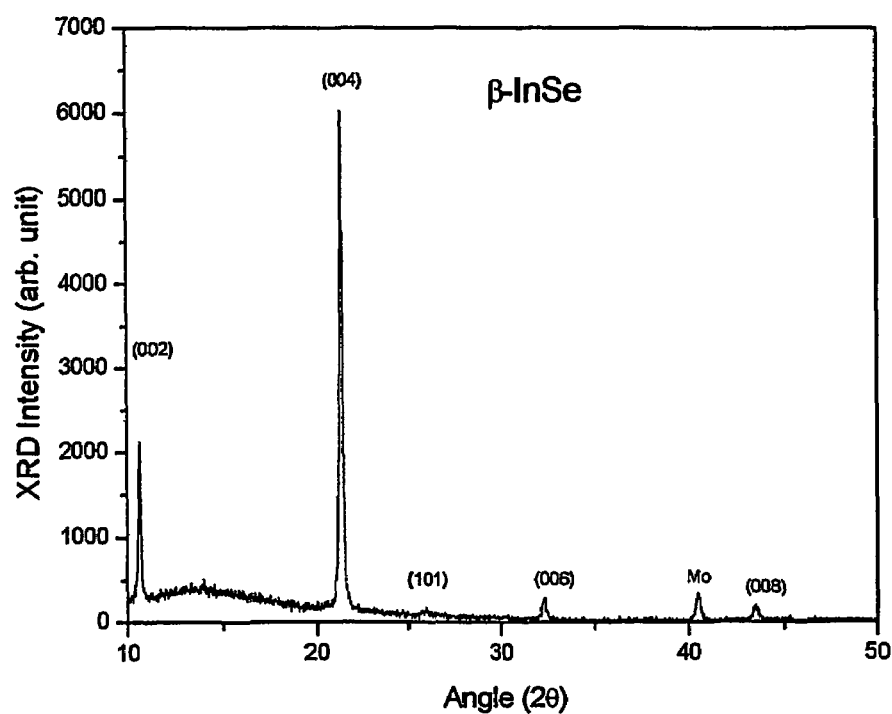
FIG. 2 is a graph showing XRD results on an InSe thin film grown in accordance with the present invention.

FIG. 2 shows XRD results on the InSe thin film grown in step S101. It shows that the structure of the β-InSe structure is good and that the formed InSe thin film exhibited good growth.

Figure 3:
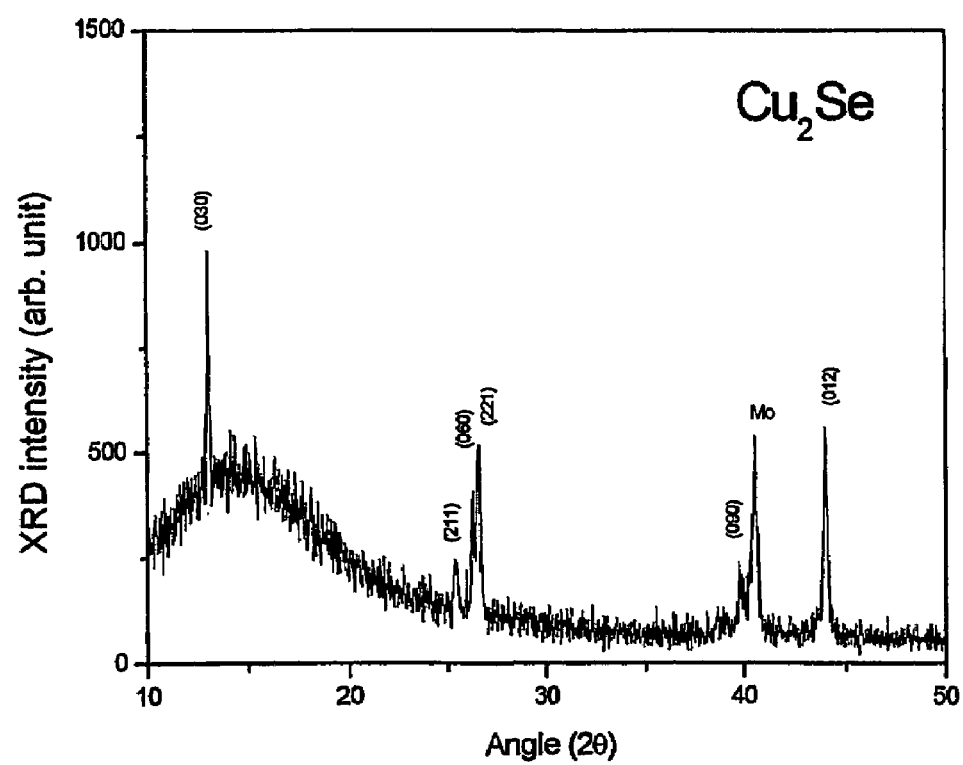
FIG. 3 is a graph showing XRD results on a $Cu_2Se$ thin film grown in accordance with the present invention.

FIG. 3 shows XRD results on the Cu$_2$Se thin film which is deposited and formed in step S102 on the InSe film formed in step S101. As can be seen, the initial InSe thin film has been covered by the Cu$_2$Se thin film. X-ray fluorescence spectroscopy (XRF) analysis confirms that In was not detected and that the second thin film was completely made of Cu$_2$Se. That is, when Cu was deposited on the InSe thin film by MOCVD using a (hfac)Cu(DMB) precursor, no In InSe layer was detectable. Rather, the XRD analysis showed the presence of Cu thus confirming coverage of the InSe layer with the layer of Cu$_s$Se.

Figure 4:
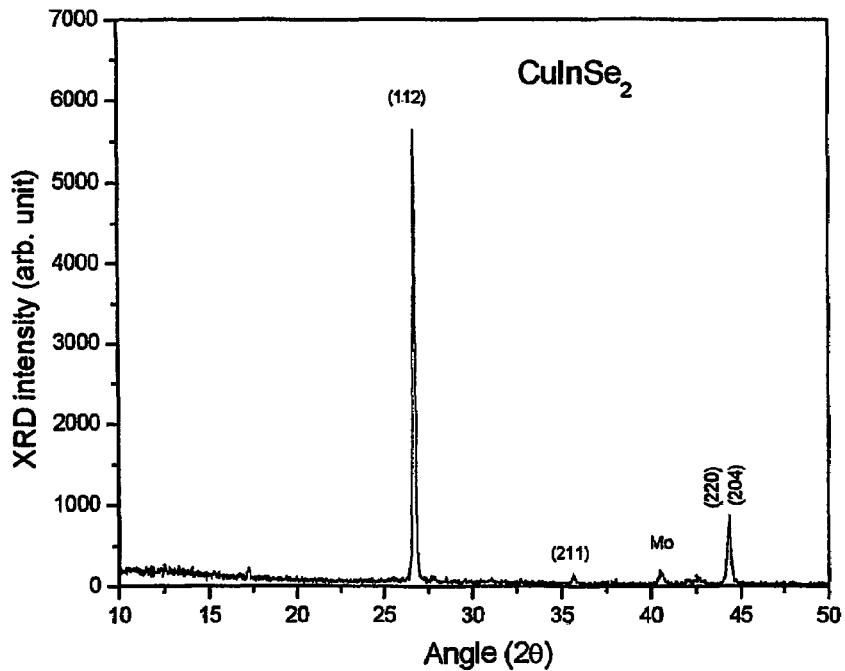
FIG. 4 is a graph showing XRD results on a $CuInSe_2$ thin film grown in accordance with the present invention.

FIG. 4 shows the XRD results on the CuInSe$_2$ thin film formed by conversion in step S103. As can be seen, XRD patterns of the grown CuInSe$_2$ thin film were consistent with those of a generally known CuInSe$_2$ single crystal. The CuInSe$_2$ thin film was shown to have a single phase of a tetragonal structure.

Figure 5:
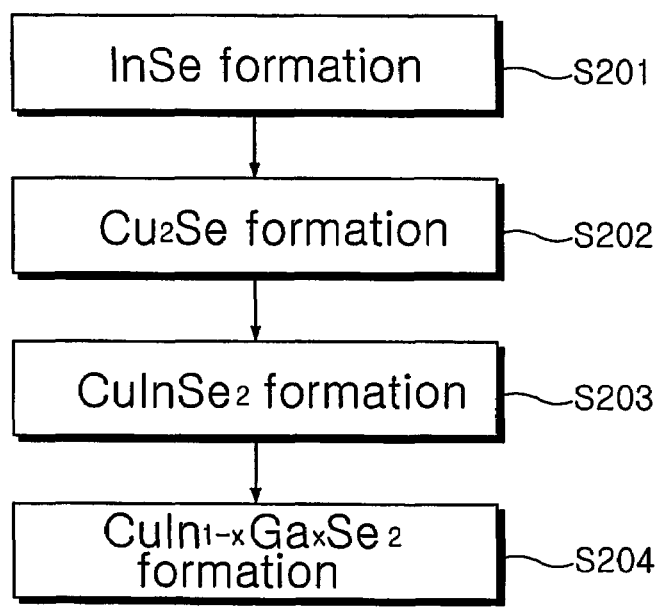
FIG. 5 is a process flow schematically illustrating production of a $CuIn_{1-x}Ga_xSe_2$ thin film in accordance with a second embodiment of the present invention.

FIG. 5 shows a process flow schematically illustrating production of a CIGS thin film in accordance with a second embodiment of the present invention.

As shown in FIG. 5, steps S201 through S203 are the same as in the above-mentioned CIS thin film production process. A CuIn$_{1-x}$Ga$_x$Se$_2$ thin film is formed on the CuInSe$_2$ thin film formed in step S203 by MOCVD using [Me$_2$Ga-(μSeMe)]$_2$, a precursor including Ga and Se (step S204). [Me$_2$Ga-(μSeMe)]$_2$ is a precursor material wherein In in [Me$_2$In-(μSeMe)]$_2$ was replaced with Ga.

In order to analyze physical properties with regard to In and Ga composition ratio of the grown CIGS thin film, 5 samples (A, B, C, D and E) having different composition ratios were prepared by differing a vapor deposition period of time in step S204 so as to adjust the composition ratio of In and Ga. In the CuIn$_{1-x}$Ga$_x$Se$_2$ thin film, a value of x, i.e., the composition ratio of [Ga]/[In+Ga] was examined by X-ray fluorescence spectroscopy thus showing 0, 0.062, 0.19, 0.34 and 0.96, respectively.

Figure 6:
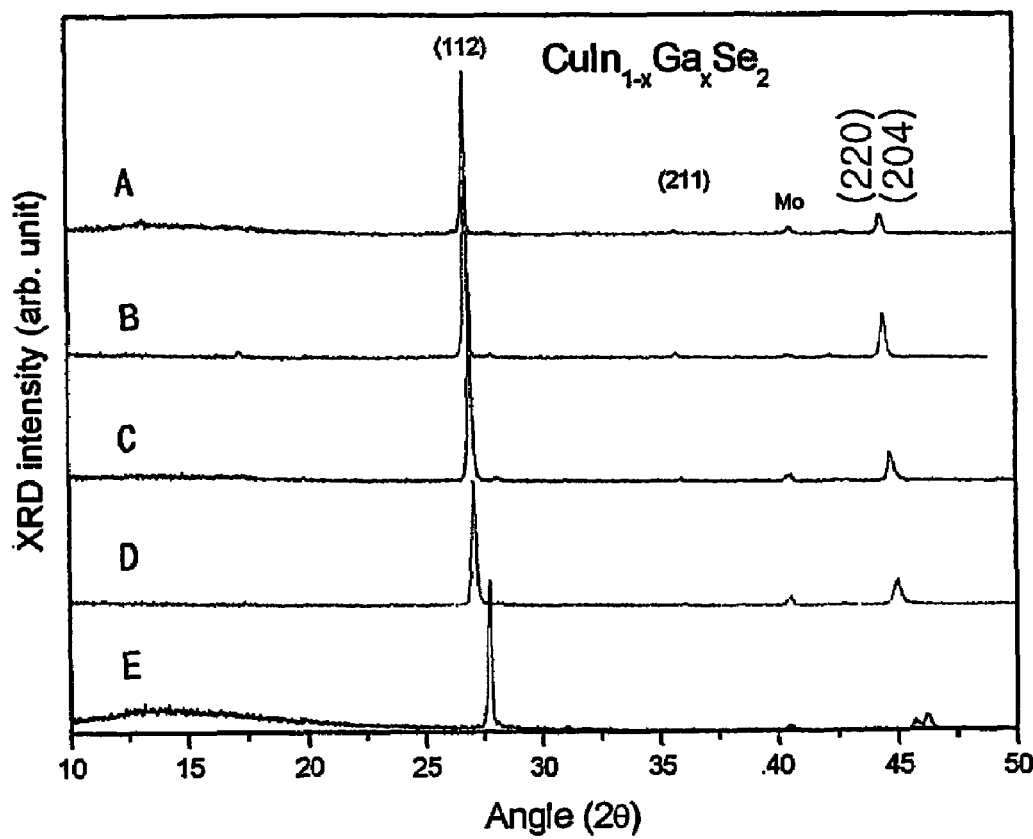
FIG. 6 is a graph showing XRD results on a $CuIn_{1-x}Ga_xSe_2$ thin film grown in accordance with the present invention.

FIG. 6 shows XRD results on CuIn$_{1-x}$Ga$_x$Se$_2$ thin films A, B, C, D and E grown in a second embodiment of the present invention. Depending on the composition ratio of [Ga]/[In+Ga], the positions of peaks has shifted to an increased angle (2θ).

Figure 7:
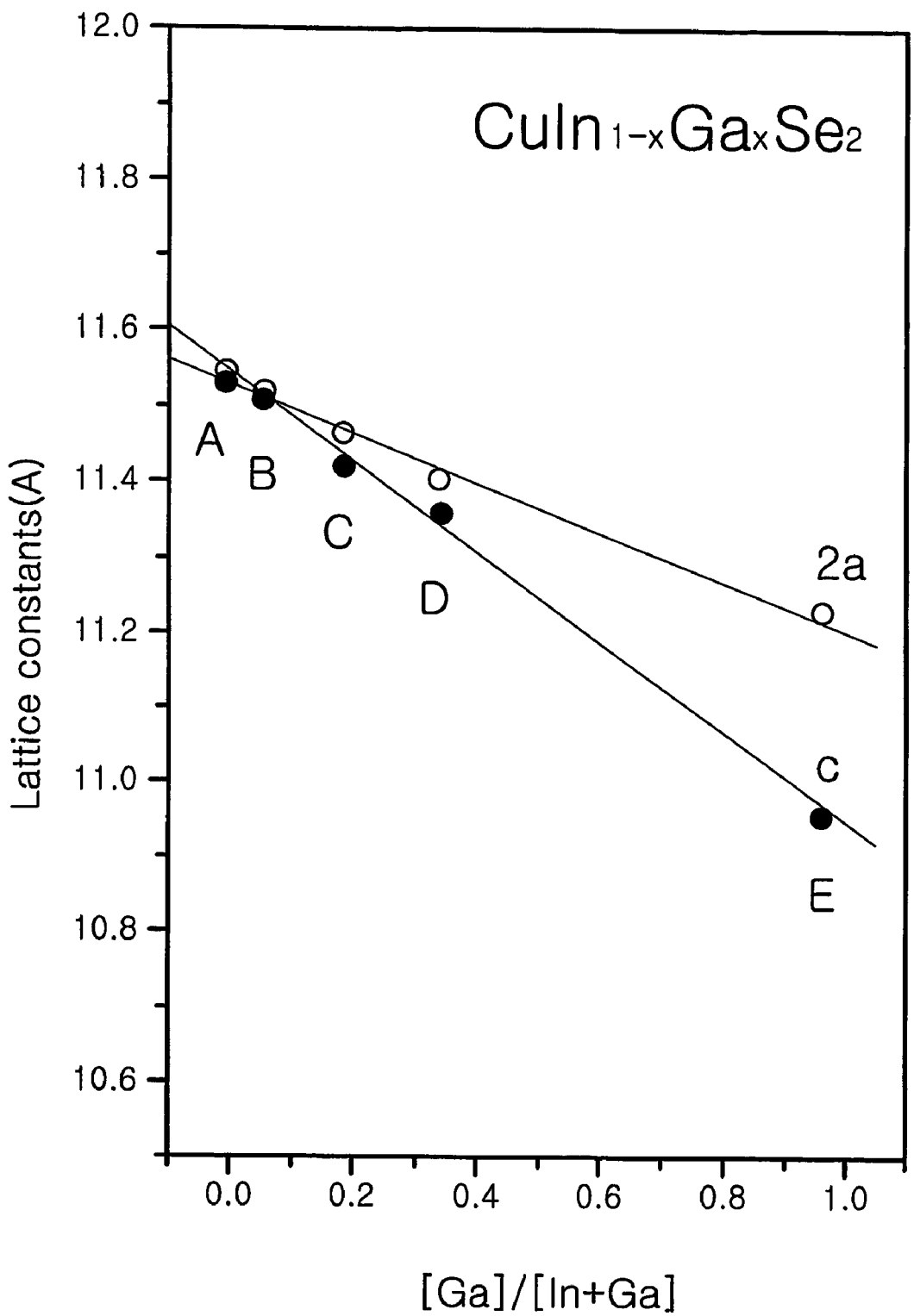
FIG. 7 is a graph showing changes in lattice constants $2a$ and $c$ with a ratio of [Ga]/[In+Ga] in a $CuIn_{1-x}Ga_xSe_2$ thin film grown in accordance with the present invention.

FIG. 7 is a graph showing changes in lattice constants 2a and c with a value of x, i.e., a composition ratio of [Ga]/[In+Ga]. As shown here, lattice constants 2a and c linearly decrease as the value of x increases. Thereby, rate of change in lattice constants 2a and c with the composition ratio of [Ga]/[In+Ga] was 0.329 and 0.602, respectively, showing significant difference therebetween. Further, the CuInSe$_2$ thin film exhibited a lattice constant of a=5.77 Å and c=11.54 Å, which is consistent with the results obtained by Gryunova. In the grown CuIn$_{1-x}$Ga$_x$Se$_2$ thin films, the highest value of x was 0.96 (sample E). In this case, the lattice constant of a=5.612 Å and c=10.953 Å was consistent with that of a=5.60 Å and c=10.98 Å of CuGaSe$_2$ which was reported by Gryunova.

Figure 8:
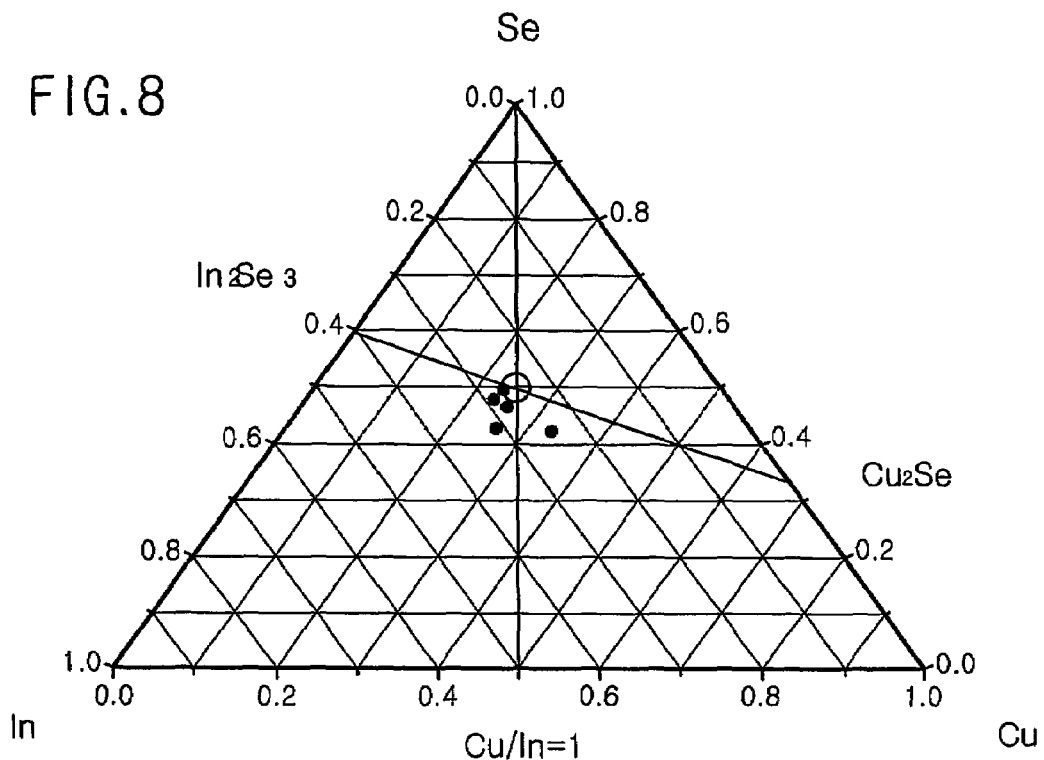
FIG. 8 is a graph showing a composition ratio of a $CuInSe_2$ thin film formed in accordance with the present invention.
Figure 9:
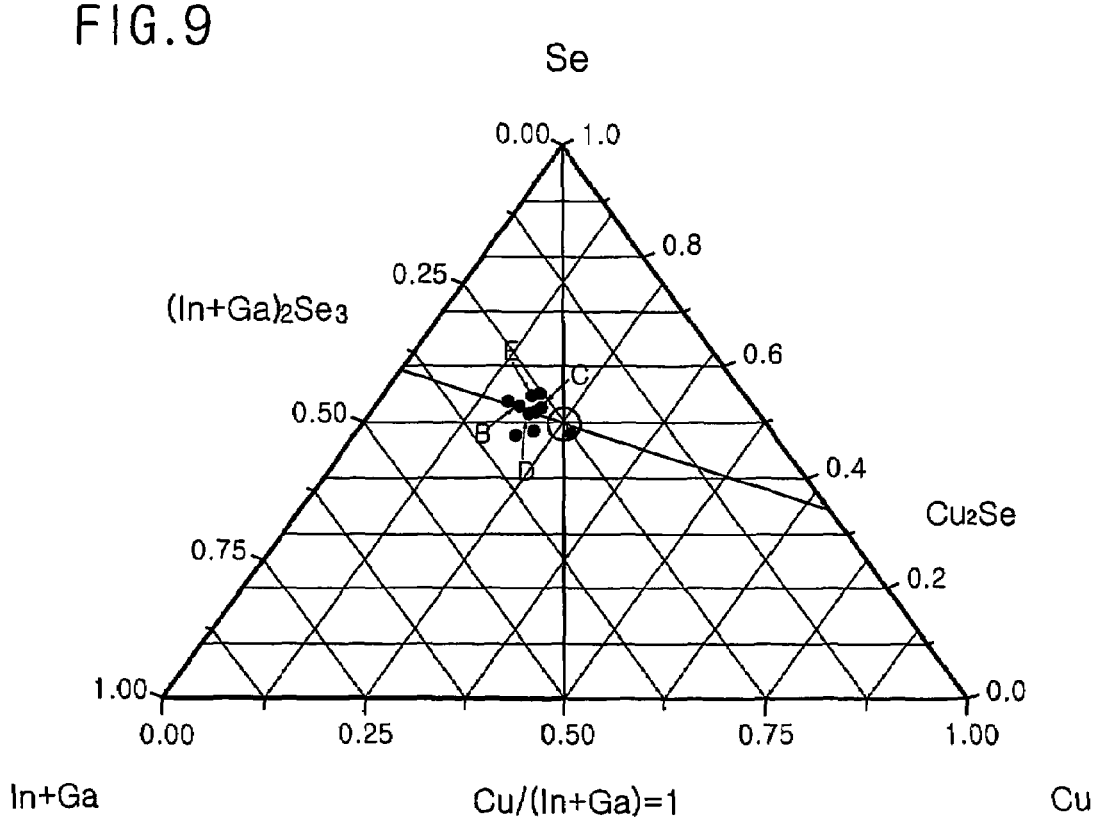
FIG. 9 is a graph showing a composition ratio of a $CuIn_{1-x}Ga_xSe_2$ thin film formed in accordance with the present invention.
Figure 10:
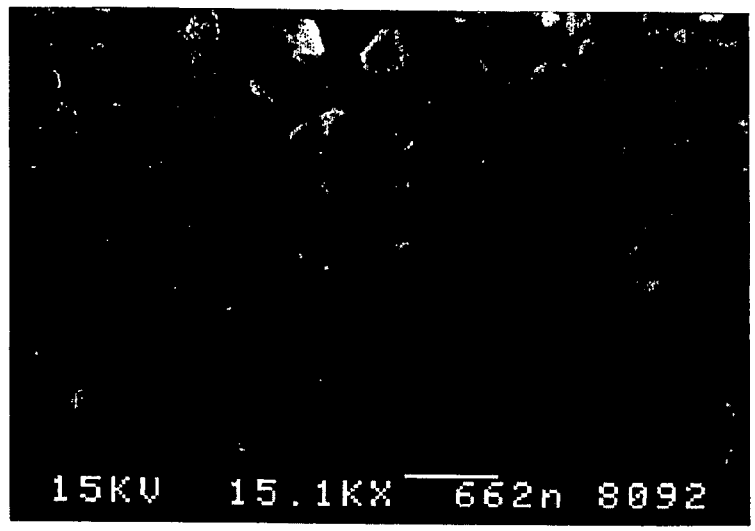
FIGS. 10 through 14 are, respectively, SEM images of samples A through E of $CuIn_{1-x}Ga_xSe_2$ thin films formed in accordance with the present invention.
Figure 11:
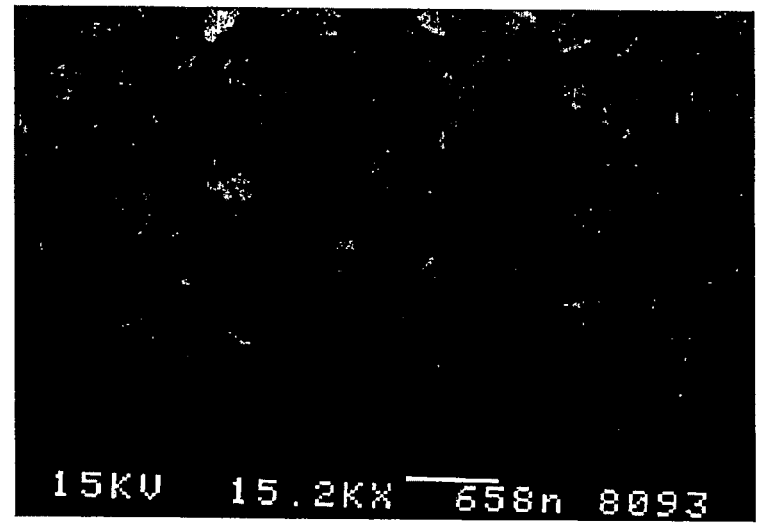
Figure 12:
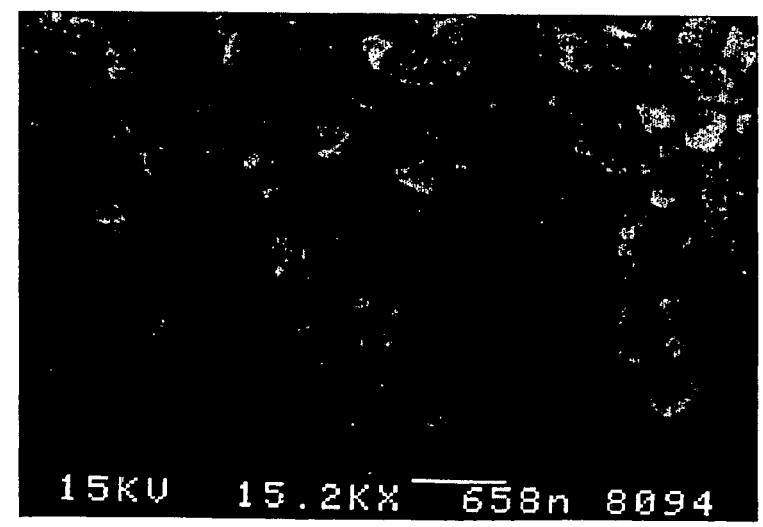
Figure 13:
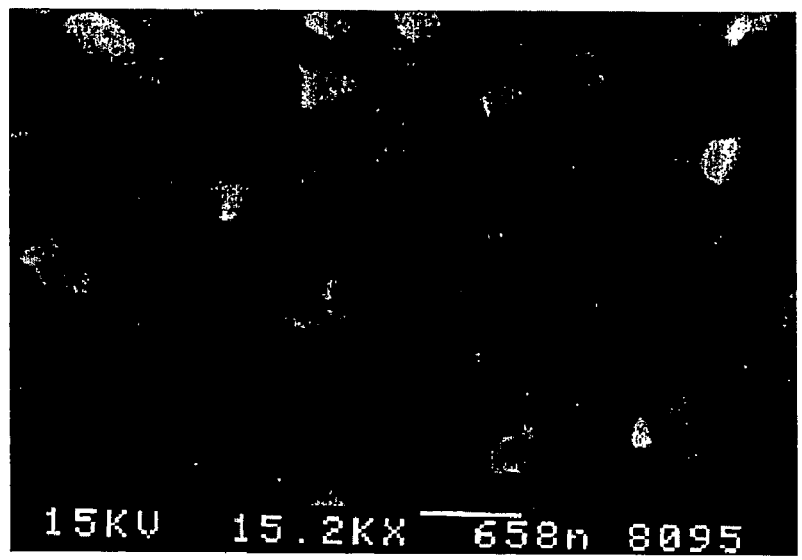
Figure 14:
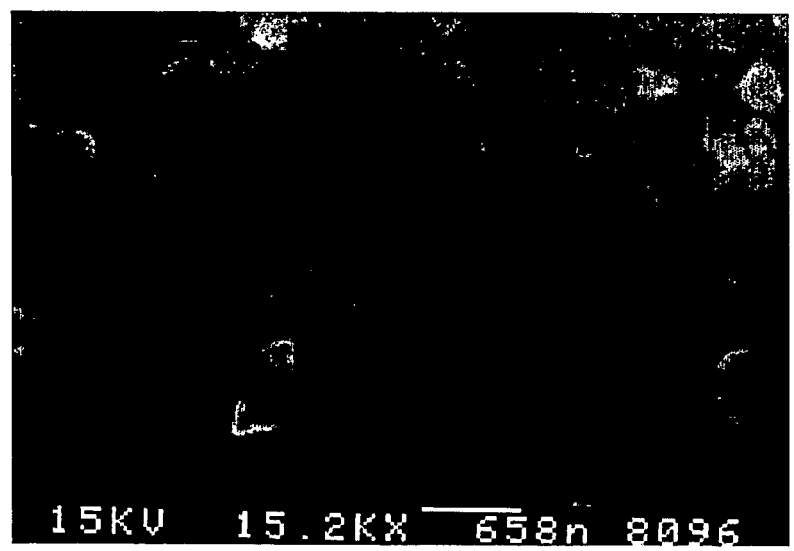

FIGS. 8 and 9 are, respectively, graphs showing the composition ratio of a CIS thin film grown in accordance with a first embodiment of the present invention and a CIGS thin film grown in accordance with a second embodiment of the present invention. A line connecting (In+Ga)$_2$Se$_3$ and Cu$_2$Se and a vertical line are defined by Groenink and Janse, and represent non-molecularity and non-stoichiometry, respectively. A circle at the center of the triangle is a point having a composition ratio of Cu:In:Se=1:1:2.

Dots in FIG. 8 represent a plurality of CuInSe$_2$ samples prepared by experimentation, and as can be seen, the CIS thin film grown in accordance with the present invention has a ratio of Cu:In:Se near to 1:1:2. Further, each of the dots B, C, D and E in FIG. 9 is for samples having a [Ga]/[In+Ga] composition ratio of 0.062, 0.19, 0.34 and 0.96, respectively, and thus it can be seen that even when the CIGS thin film was grown by varying the ratio of In and Ga, a Cu:(In,Ga):Se ratio is maintained at almost 1:1:2 ratio.

As can be seen from the foregoing, CIS and CIGS thin films grown in accordance with the present invention were prepared to have a very near chemical equivalence ratio. Therefore, in accordance with the present invention, it is possible to simply prepare a good quality thin film having a desired equivalence ratio by MOCVD capable of performing mass production thereof without difficulty. Further, it is possible to have a value near to 1:1:2 ratio of Cu:In(Ga):Se of the thin film obtained even when the ratio of [Ga]/[In+Ga] was adjusted as desired.

FIGS. 10 through 14 are, respectively, surface SEM images of samples A, B, C, D and E of CIGS thin films grown in accordance with the present invention. All of them show crystal growth of constant grains and thus it represents that crystal growth progresses well regardless of the composition ratio of [Ga]/[In+Ga].

In addition, in accordance with a third embodiment of the present invention, by using [Me$_2$In-(μTeMe)]$_2$ or [Me$_2$In-(μSMe)]$_2$ instead of [Me$_2$Ga-(μSeMe)]$_2$ used as the precursor in step S204 of the second embodiment, a portion of Se may be replaced with Te or S. As a result, the grown thin film is CuIn(Se,S) or CuIn(Se,Te).

Although the present invention was described by way of the preferred embodiments, the technical aspect of the present invention is not limited thereto. That is, even though as the thin film for a solar cell, a process for producing the CuIn$_{1-x}$Ga$_x$Se$_2$ (provided that, 0≦x≦1) and CuIn(Se,S) thin films was illustrated, these films are only several examples of I-III-VI$_2$ compounds composed of elements selected from Groups I, III and VI of the Periodic Table.

Specific examples are described hereinafter. First, as a first step, a III-VI thin film was formed by Metal Organic Chemical Vapor Deposition using a single precursor including elements of Groups III and VI. Elements of Group III include all the elements belonging to Group III of the Periodic Table of Elements, such as In, Ga or Al, and elements of Group VI include all the elements belonging to Group VI of the Periodic Table of Elements, such as Se, S or Te. Therefore, the grown III-VI thin film is either InSe, GaSe, AlSe, InS, GaS, AlS, InTe, GaTe or AlTe.

In a second step, an I$_2$-VI thin film was formed on the III-VI thin film by Metal Organic Chemical Vapor Deposition using a precursor (including monovalent or bivalent precursor) including metals of Group I (for example, such as Ag or Cu). Elements of Group I include all the elements belonging to Group I of the Periodic Table of Elements, such as Cu or Ag.

Therefore, the grown $I_2$-VI thin film is either $Cu_2Se$, $Cu_2S$, $Cu_2Te$, $Ag_2Se$, $Ag_2S$ or $Ag_2Te$.

In a third step, an I-III-$VI_2$ thin film was formed on the $I_2$-VI thin film by Metal Organic Chemical Vapor Deposition using a single precursor including elements of Groups III and VI so as to complete a thin film for a solar cell in accordance with the present invention. Herein, elements of Groups III and VI are the same as the elements used in the first step.

Further, in a fourth step, it is possible to prepare a solid solution semiconductor compound of the I-III-$VI_2$ thin film on the I-III-$VI_2$ thin film by Metal Organic Chemical Vapor Deposition using a single precursor including other elements of Groups III and VI. In this case, elements of Groups III and VI used herein are different from those used in the first and third steps. Consequently, the thin films thus obtained include $CuIn_{1-x}Ga_xSe_2$, $CuIn_{1-x}Al_xSe_2$, $CuGa_{1-x}Al_xSe_2$, $AgIn_{1-x}Ga_xSe_2$, $AgIn_{1-x}Al_xSe_2$, $AgIn_{1-x}Ga_xSe_2$, $CuIn(Se,S)_2$, $CuGa(Se,S)_2$, $AgIn(Se,S)_2$, $AgGa(Se,S)_2$, $CuIn(Se,Te)_2$, $CuGa(Se,Te)_2$, $AgIn(Se,Te)_2$, $AgGa(Se,Te)_2$, $CuIn(S,Te)_2$, $CuGa(S,Te)_2$, $AgIn(S,Te)_2$ and $AgGa(S,Te)_2$.

Therefore, the technical aspect of the present invention should be construed as disclosing a process for producing any I-III-$VI_2$ compound and solid solution thereof.

The inventive single precursor including elements of Groups III and VI is not limited to the precursor of [$Me_2$(III)-($\mu$(VI)Me)] type used in the first, second and third embodiments of the present invention, and it is apparent to those skilled in the art that any other type of precursors which were not exemplified in the present invention may be used. In brief, since elements belonging to the same Group of the Periodic Table have similar chemical characteristics, similar results will be obtained even with use of different precursors. Similarly, the precursor including Cu is not limited to (hfac)Cu(DMB).

INDUSTRIAL APPLICABILITY

As apparent from the above description, in accordance with the present invention, it is possible to produce a good quality $CuIn_{1-x}Ga_xSe_2$ thin film for a solar cell having a desired equivalence ratio by simply controlling growth conditions of semiconductor compounds.

Further, in accordance with the present invention, it is also possible to realize mass production of a $CuIn_{1-x}Ga_xSe_2$ thin film for a solar cell at lower production costs by a simple production process.

In addition, in accordance with the present invention, the production process may be configured to be safer and more environmentally-friendly by using relatively low toxicity compounds as a precursor for producing a $CuIn_{1-x}Ga_xSe_2$ thin film for a solar cell.

Still further, the present invention uses flexible metals as a substrate and thus a shape of the solar cell may be freely changed as desired, thereby extending application area thereof.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A process for producing a thin film of an I-III-$VI_2$ compound of an element from each of Groups I and III of the Periodic Table with two atoms of a Group VI element, comprising:

(i) forming a thin film of an III-VI compound on a substrate by Metal Organic Chemical Vapor Deposition employing a single precursor containing elements of Groups III and VI;

(ii) forming a thin film of an $I_2$-VI compound on the thin film of the III-VI compound by Metal Organic Chemical Vapor Deposition employing a precursor containing at least one metal of Group I; and (iii) forming a thin film of the I-III-$VI_2$ compound on the thin film of the $I_2$-VI compound by Metal Organic Chemical Vapor Deposition employing a single precursor containing elements of Groups III and VI, wherein, in the steps of the process, the element of Group I is Cu or Ag, the element of Group III is at least one of Al, Ga or In, and the element of Group VI is at least one of S, Se or Te.

2. The process as set forth in claim 1, further comprising:

(iv) forming a thin film of an I-III-$VI_2$ compound on the thin film of the I-III-$VI_2$ compound formed in (iii) by Metal Organic Chemical Vapor Deposition employing a single precursor containing elements of Groups III and VI, and wherein elements of Group III employed in (iv) are different from those employed in (i) and (iii).

3. The process as set forth in claim 1, further comprising:

(iv) forming a thin film of an I-III-$VI_2$ compound on the thin film of the I-III-$VI_2$ compound formed in (iii) by Metal Organic Chemical Vapor Deposition employing a single precursor containing elements of Groups III and VI, and wherein elements of Group VI employed in (iv) are different from those employed in (i) and (iii).

4. The process as set forth in any one of claims 1 through 3, wherein the precursors of (i) and (ii) are [$Me_2$In-($\mu$SeMe)]$_2$.

5. The process as set forth in any one of claims 1 through 3, wherein the precursor employed in (ii) is (hfac)Cu(DMB).

6. The process as set forth in claim 2, wherein the precursor of (iv) is [$Me_2$Ga-($\mu$SeMe)]$_2$.

7. The process as set forth in claim 2, wherein the thin film of a compound symbolized by the formula: Group I-Group III-Group $VI_2$ is selected from the group consisting of $CuIn_{1-x}Ga_xSe_2$, $CuIn_{1-x}Al_xSe_2$, $CuGa_{1-x}Al_xSe_2$, $AgIn_{1-x}GaSe_2$, $AgIn_{1-x}Al_xSe_2$ and $AgIn_{1-x}Ga_xSe_2$, wherein x ranges from 0 to 1.

8. The process as set forth in claim 3, wherein the thin film of an I-III-$VI_2$ compound is selected from the group consisting of $CuIn(Se,S)_2$, $CuGa(Se,S)_2$, $AgIn(Se,S)_2$, $AgGa(Se,S)_2$, $CuIn(Se,Te)_2$, $CuGa(Se,Te)_2$, $AgIn(Se,Te)_2$, $AgGa(Se,Te)_2$, $CuIn(S,Te)_2$, $CuGa(S,Te)_2$, $AgIn(S,Te)_2$ and $AgGa(S,Te)_2$.

9. A process for producing an absorption layer for a solar cell, comprising:

forming a thin film of InSe on a substrate by Metal Organic Chemical Vapor Deposition employing a single precursor containing In and Se;

forming a thin film of $Cu_2Se$ on the InSe thin film by Metal Organic Chemical Vapor Deposition employing a Cu precursor; and forming a thin film of $CuInSe_2$ on the $Cu_2Se$ thin film by Metal Organic Chemical Vapor Deposition employing a single precursor containing In and Se.

10. The process as set forth in claim 9, further comprising:

forming a thin film of $CuIn_{1-x}Ga_xSe_2$, wherein x ranges from 0 to 1, on the thin film of $CuInSe_2$ by Metal Organic Chemical Vapor Deposition employing a single precursor containing Ga and Se.

* * * * *